United States Patent [19]

Tabatabaie

[11] Patent Number: 5,285,466
[45] Date of Patent: Feb. 8, 1994

[54] FEEDBACK MECHANISM FOR VERTICAL CAVITY SURFACE EMITTING LASERS

[75] Inventor: Ned Tabatabaie, Maple Bluff, Wis.

[73] Assignee: Wisconsin Alumni Research Foundation, Madison, Wis.

[21] Appl. No.: 886,124

[22] Filed: May 20, 1992

[51] Int. Cl.$^5$ ............................................... H01S 3/19
[52] U.S. Cl. ........................................ 372/50; 257/80; 372/92
[58] Field of Search ................ 372/50, 38, 45, 46, 372/92; 257/80

[56] References Cited

U.S. PATENT DOCUMENTS

| | | | |
|---|---|---|---|
| 4,947,400 | 8/1990 | Dutta | 372/50 |
| 5,101,246 | 3/1992 | Onodera | 257/80 |
| 5,132,982 | 7/1992 | Chan et al. | 372/50 |
| 5,136,603 | 8/1992 | Hasnain et al. | 372/50 |

OTHER PUBLICATIONS

"Surface Emitting Semiconductor Lasers", Kenichi Iga et al, IEEE Journal of Quantum Electronics, vol. 24, No. 9, Sep. 1988, pp. 1845–1854.

"Monolithic Integration of Photodetector With Vertical Cavity Surface Emitting Laser", G. Hasnain et al, Electronics Letters, vol. 27, No. 18, Aug. 29, 1991, pp. 1630–1632.

"GaAs Vertical-Cavity Surface Emitting Lasers Fabricated by Reactive Ion Etching", Kent D. Choquette et al, IEEE Photonics Technology Letters vol. 3, No. 10, Oct. 1991, pp. 859–862.

*Primary Examiner*—James W. Davie
*Attorney, Agent, or Firm*—Andrus, Sceales, Starke & Sawall

[57] ABSTRACT

A vertical cavity surface emitting laser, VCSEL, and detector combination includes a plurality of VCSEL diodes (14, 16a) monolithically integrated on a substrate (12) A forwardly biased lasing VCSEL diode (14) emits light in a vertical axial direction (26) and in a horizontal lateral direction (44). A laterally adjacent detector VSCEL diode (16a), which is unbiased or is reverse biased, receives the lateral light from the lasing VCSEL diode (14) and generates detector output current, which provides feedback (50) control of the forward biasing circuit (24) for the lasing VCSEL diode (14). The combination also provides an electrical-optical-electrical transducer and isolator.

5 Claims, 2 Drawing Sheets

FEEDBACK MECHANISM FOR VERTICAL CAVITY SURFACE EMITTING LASERS

This invention was made with the United States Government support awarded by the National Science Foundation (NSF) Presidential Young Investigator Award, Grant No. ECS-9058153. The United States Government has certain rights in this invention.

BACKGROUND AND SUMMARY

The invention relates to a vertical cavity surface emitting laser, VCSEL.

A VCSEL is an injection diode laser where the laser oscillation and output occur normal to the pn junction plane, "Surface Emitting Semiconductor Lasers", Kenichi Iga et al, IEEE Journal of Quantum Electronics, Vol. 24, No. 9, September 1988, pp. 1845-1854 and "GaAs Vertical-Cavity Surface Emitting Lasers Fabricated by Reactive Ion Etching", Kent D. Choquette et al, IEEE Photonics Technology Letters, Vol. 3, No. 10, October 1991, pp. 859-862. Desirable properties include low divergence circular output, single longitudinal mode operation, and high two-dimensional packing density for arrays, which makes VCSELs attractive for applications such as optical recording, communications, and computing.

Most applications of semiconductor lasers require dynamic stabilization and control of the light output, which in turn requires a feedback circuit from a detector to the forward biasing circuit controlling laser injection. It is known to provide a separate light detector for monitoring the laser light output, and providing a feedback connection from the detector to the circuit forward biasing the VCSEL diode. It is also known to monolithically integrate a photodiode on either the top or the bottom of the VCSEL such that the axially vertically emitted light impinges the photodiode, and the latter provides the feedback signal, "Monolithic Integration of Photodetector With Vertical Cavity Surface Emitting Laser", G. Hasnain et al, Electronics Letters, Vol. 27, No. 18, Aug. 29, 1991, pp. 1630-1632. While the monolithic integration of the laser and detector should result in lower packaging cost, it has been found that the structure is too complex and costly to manufacture.

The present invention provides an integrated VCSEL and detector combination which is particularly simple and cost effective. Lateral horizontally emitted light from the VCSEL diode is monitored as an indication of the axially vertically emitted light. One or more of the VCSEL diodes on the substrate is used as a detector. The remaining VCSEL diodes are forward biased in normal manner for laser injection, and emit light vertically axially and horizontally laterally. The lateral light impinges the detector diode to cause current flow therein, which current is monitored, to provide a feedback signal for controlling the forward biasing circuit for the lasing diodes. The invention enables the noted detection for feedback control in a monolithic integrated structure, without a separate detector, and without special or additional crystal growth and processing steps otherwise required for a vertically integrated detector. The invention enables the existing structure of a VCSEL to be used.

The invention also provides an electrical-optical-electrical transducer wherein electric current in the forward biasing circuit for the lasing diodes stimulates laser light emitted horizontally laterally which in turn impinges a laterally adjacent non-lasing VCSEL diode to cause current flow therein.

FIG. shows a VCSEL and detector combination in accordance with the invention.

Figure 3:
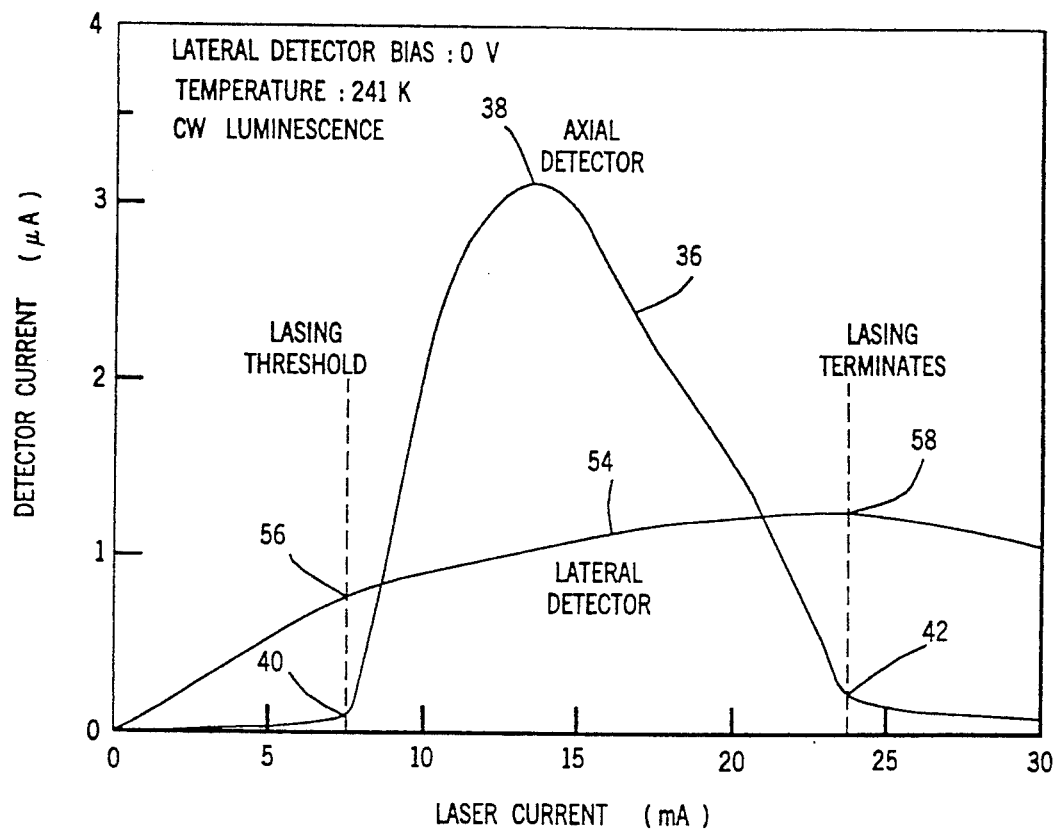

FIG. 3 is a graph showing laser current versus detector current.

Figure 4:
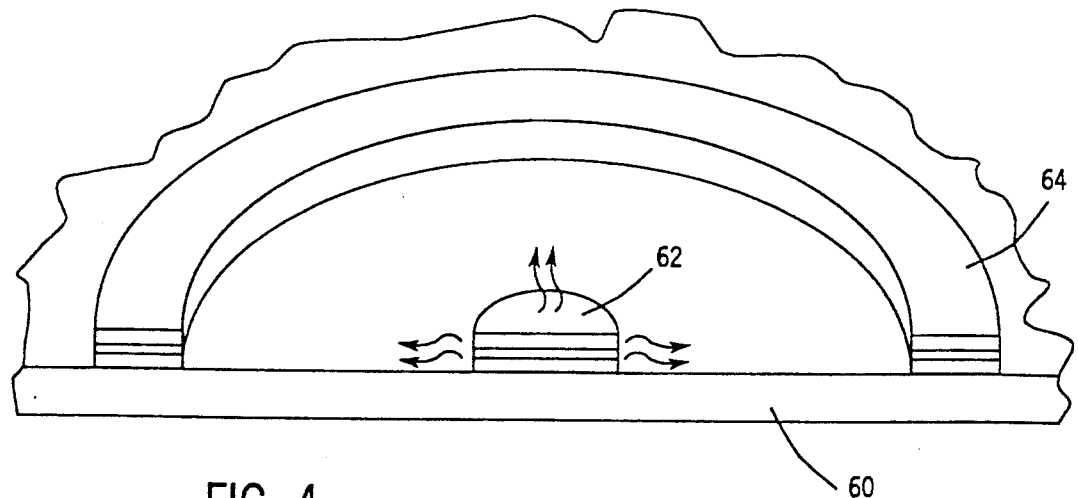

FIG. 4 shows an alternate embodiment of the invention.

DETAILED DESCRIPTION

Prior Art

Figure 1:
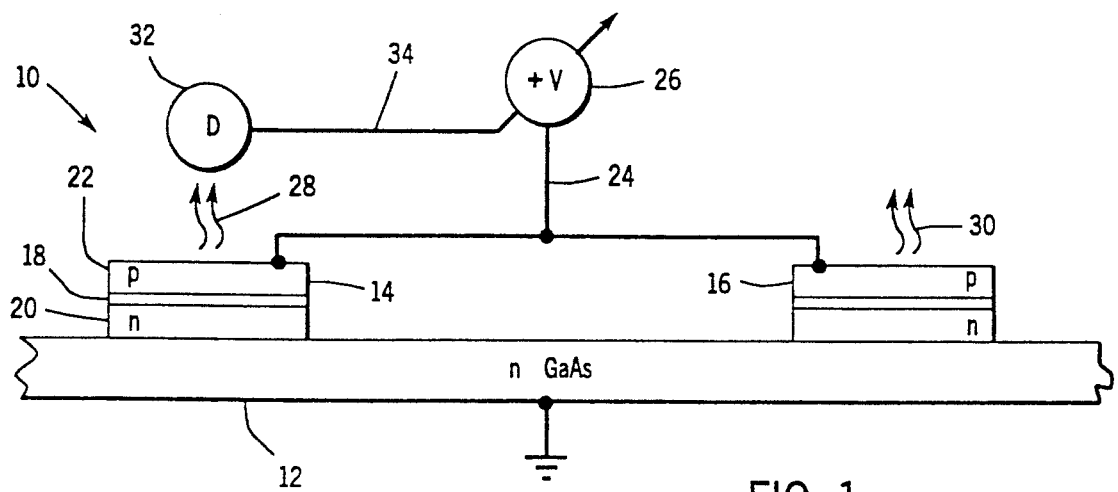
FIG. 1 shows a vertical cavity surface emitting laser, VCSEL, known in the prior art.

FIG. 1 shows a vertical cavity surfacing emitting laser, VCSEL, 10, including a semiconductor substrate 12, such as n type gallium arsenide, and a plurality of VCSEL diodes 14, 16, etc. integrated thereon. The VCSEL diode is formed by a quantum-well active region 18 sandwiched between an n type multi-layer distributed Bragg reflector, DBR, stack 20, and a p type multi-layer DBR stack 22, and for which further reference is made to the above noted Hasnain et al, Choquette et al, and Iga et al references. The VCSEL diodes are forward biased by a biasing circuit 24, including voltage source 26, and emit light in a vertical axial direction, as shown at 28, 30. This light is monitored by a current sensor detector 32 which provides a control signal at feedback connection 34 to the forward biasing circuit to control laser injection and light output.

FIG. 3 shows laser current in milliamps on the horizontal axis, and detector current in microamps on the vertical axis. The laser current supplied by forward biasing circuit 24 is controlled by the feedback signal at 34 to maintain axial detector current 36 near peak value 38, for optimum operation, though the laser may be operated at other current values between its lasing limits 40 and 42, where lasing begins and terminates, respectively. It is known in the prior art to vertically integrate detector 32 with the VCSEL diode, for example as shown in FIG. 1 of the above noted Hasnain et al reference.

Present Invention

Figure 2:
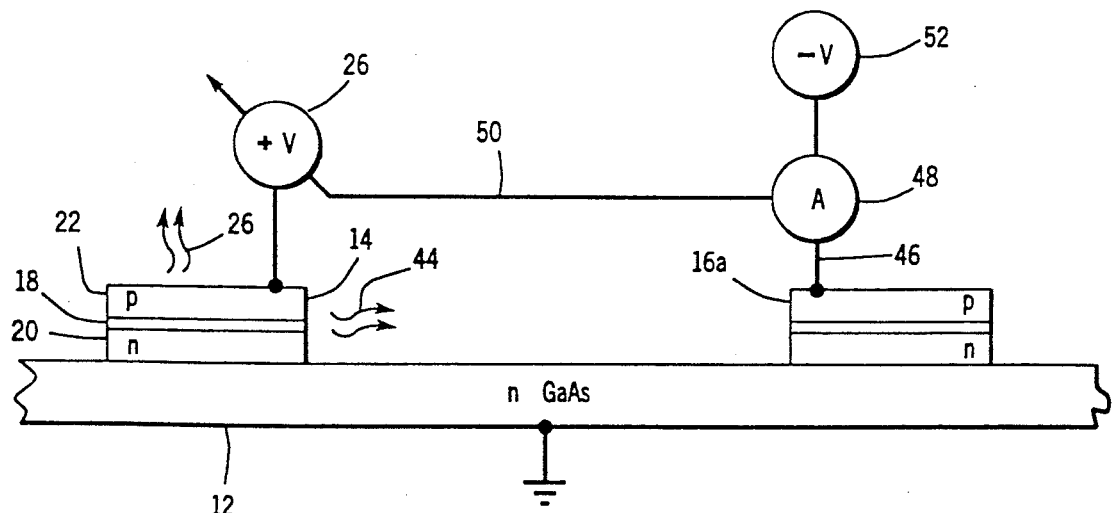

FIG. 2 uses like reference numerals from FIG. 1 where appropriate to facilitate understanding. The structure in FIG. 2 is the same as that in FIG. I, and in the preferred embodiment in accordance with the above noted Choquette et al reference. VCSEL diode 14 in FIG. 2 is forward injection biased by the forward biasing circuit 24 as in FIG. 1. VCSEL diode 16a in FIG. 2 is identical to VCSEL diode 16 in FIG. 1, however, VCSEL diode 16a is not biased by circuit 24, but instead is used as a detector. Lasing diode 14 emits light vertically axially as shown at 28, and also emits light horizontally laterally as shown at 44, as known in the art, for example as shown in FIG. 5 of the above noted Iga et al reference. Detector diode 16a is integrated on substrate 12 laterally adjacent lasing diode 14 and receives lateral light therefrom. The light impinging on diode 16a causes current flow therein, through detector circuit 46, which current is sensed by a current sensor such as ammeter 48 which provides a sensed current detector signal on feedback connection 50 to forward biasing circuit 24 for adjusting the forward biasing of lasing VCSEL diode 14 to adjust light emission. Diode 16a may be unbiased, or may be reverse biased by a negative voltage source 52. Reverse biasing is preferred in those applications where it is desired to deplete part of the p and n regions, enabling shorter optical wavelengths corresponding to the semiconductor bandgap in the reflector regions to be absorbed. Furthermore, application of reverse bias can provide for internal detector gain through impact ionization by the photogenerated carriers in the diode depletion region. In this way, a detector current equal to or greater than the laser current can be achieved. This is particularly useful if the structures are being used in the transducer configuration, to be described. In such applications, the laser current can be optically coupled and exactly replicated in several receiver diodes.

FIG. 3 shows at curve 54 lateral detector current sensed by sensor 48. At the lasing threshold 40, curve 54 exhibits a transition in slope at 56. At lasing termination 42, lateral detector current is about at its maximum value at 58. Points 56 and 58 provide correlation to the lasing thresholds of diode 14, and the feedback signal at feedback connection 50 is calibrated to maintain the laser current roughly at the desired output level between points 56 and 58, such as the maximum axially emitted light corresponding to peak 38.

In the embodiment in FIG. 2, detector diode 16a is identical to laser diode 14, i.e. the plurality of horizontal layers forming vertical stack 16a is identical to the plurality of horizontal layers forming vertical stack 14, just as stack 16, FIG. 1, is identical to stack 14. This is desirable because it enables the use of existing VCSEL structure, without additional or modified crystal growth or processing steps. The existing structure provides lasing light emission and also the detection thereof for feedback control purposes. In this embodiment, the laser and the detector diodes are freely interchangeable.

FIG. 4 shows a further embodiment including a substrate 60, a lasing VCSEL diode 62 integrated thereon, and a detector VCSEL diode 64 integrated thereon in the form of an annulus surrounding lasing diode 62 and providing full circle 360° light absorption, which is desirable in those applications where it is preferred to eliminate cross-talk to other diodes.

In a further application, the invention provides an electrical-optical-electrical transducer and isolator. Circuit 24 forward biases VCSEL lasing diode 14 to stimulate diode 14 to emit light axially vertically, and to emit light laterally horizontally to impinge VCSEL detector diode 16a from which current flows through circuit 46, such that current flow in circuit 24 causes current flow in circuit 46.

It is recognized that various equivalents, alternatives and modifications are possible within the scope of the appended claims.

I claim:

1. A vertical cavity surface emitting laser, VCSEL, and detector combination, comprising:
   a semiconductor substrate;
   a VCSEL diode integrated on said substrate and comprising a plurality of horizontal layers, one on top of another, in a vertical stack, including at least one p layer and at least one n layer, and emitting light in a vertical axial direction and in a horizontal lateral direction;
   a detector integrated on said substrate laterally adjacent said VCSEL diode and receiving lateral light therefrom,
   wherein said detector comprises a second plurality of horizontal layers, one on top of another, in a second vertical stack, including at least one p layer and at least one n layer, and said second stack is an annulus laterally surrounding said first stack.

2. A vertical cavity surface emitting laser, VCSEL, and detector combination, comprising:
   a semiconductor substrate;
   a lasing VCSEL diode integrated on said substrate and comprising a first plurality of horizontal layers, one on top of another, in a first vertical stack, including at least one p layer and at least one n layer, and emitting light in a vertical axial direction and in a horizontal lateral direction;
   a detector VCSEL diode integrated on said substrate laterally adjacent said lasing VCSEL diode and receiving lateral light therefrom, said detector VCSEL diode comprising a second plurality of horizontal layers, one on top of another, in a second vertical stack, including at least one p layer and at least one n layer;
   a first circuit forward biasing said first stack;
   a second circuit sensing current flow in said second stack;
   a current sensor in said second circuit;
   a feedback connection from said current sensor to said first circuit for adjusting the forward biasing of said first stack to adjust light emission from said lasing VCSEL diode.

3. An electrical-optical-electrical transducer and isolator comprising a semiconductor substrate having a plurality of laterally spaced vertical cavity surface emitting laser, VCSEL, diodes integrated thereon, each diode comprising a plurality of horizontal layers, one on top of another, in a vertical stack, including at least one p layer and at least one n layer, a first circuit forward biasing a first of said VCSEL diodes to stimulate said first VCSEL diode to emit light axially vertically, and to emit light laterally horizontally to impinge a second of said VCSEL diodes, a second circuit through which current flows from said second VCSEL diode, such that current flow in said first circuit causes current flow in said, second circuit.

4. A method for feedback control of a vertical cavity surface emitting laser, VCSEL, comprising providing a semiconductor substrate having a plurality of VCSEL diodes integrated thereon, each diode comprising a plurality of horizontal layers, one on top of another, in a vertical stack, including at least one p layer and at least one n layer, forward biasing one of said VCSEL diodes to stimulate laser light emission in a vertical axial direction and in a horizontal lateral direction, using another of said VCSEL diodes as a detector receiving lateral light from the lasing VCSEL diode, sensing detector current through the detector VCSEL diode and providing a feedback signal controlling forward biasing of the lasing VCSEL diode.

5. A method for transducing a first electrical current to a second electrical current and providing isolation therebetween, comprising providing a semiconductor substrate having a plurality of laterally spaced vertical cavity surface emitting laser, VCSEL, diodes integrated thereon, each diode comprising a plurality of horizontal layers, one on top of another, in a vertical stack, including at least one p layer and at least one n layer, providing a first electrical current in a first circuit forward biasing a first of said VCSEL diodes to stimulate said first VCSEL diode to emit light axially vertically, and to emit light laterally horizontally to impinge a second of said VCSEL diodes, providing a second circuit through which current flows from said second VCSEL diode, such that current flow in said first circuit causes current flow in said second circuit.

* * * * *